US008890004B2

(12) United States Patent
Wickes et al.

(10) Patent No.: US 8,890,004 B2
(45) Date of Patent: Nov. 18, 2014

(54) ELECTRICAL CONNECTOR ASSEMBLY WITH EMI COVER

(75) Inventors: Evan Charles Wickes, Harrisburg, PA (US); Michael Warren Fogg, Harrisburg, PA (US); Steven David Dunwoody, Middletown, PA (US); Richard James Long, Columbia, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 494 days.

(21) Appl. No.: 13/355,905

(22) Filed: Jan. 23, 2012

(65) Prior Publication Data

US 2013/0186681 A1     Jul. 25, 2013

(51) Int. Cl.
*H05K 9/00*       (2006.01)
*H01R 13/648*    (2006.01)
*H01R 13/6583*   (2011.01)

(52) U.S. Cl.
CPC .......... *H01R 13/6583* (2013.01); *H05K 9/0009* (2013.01)
USPC ........ 174/382; 174/359; 174/354; 439/607.2; 439/607.21

(58) Field of Classification Search
CPC . H01R 13/6583; H05K 9/0009; G02B 6/4246
See application file for complete search history.

(56) References Cited

U.S. PATENT DOCUMENTS

| | | | |
|---|---|---|---|
| 6,416,361 B1 * | 7/2002 | Hwang | 439/607.2 |
| 6,612,868 B2 * | 9/2003 | Hwang | 439/607.54 |
| 6,752,663 B2 * | 6/2004 | Bright et al. | 439/607.25 |
| 6,816,376 B2 | 11/2004 | Bright et al. | |
| 6,866,544 B1 * | 3/2005 | Casey et al. | 439/607.2 |
| 6,875,056 B1 * | 4/2005 | Bianchini et al. | 439/607.2 |
| 6,980,437 B2 | 12/2005 | Bright | |
| 7,001,217 B2 | 2/2006 | Bright et al. | |
| 7,150,653 B1 * | 12/2006 | Mason | 439/607.18 |
| 7,438,596 B2 | 10/2008 | Phillips | |
| 7,473,139 B2 * | 1/2009 | Barringer et al. | 439/607.17 |
| 7,481,677 B1 * | 1/2009 | Yi et al. | 439/607.01 |
| 7,507,120 B1 * | 3/2009 | Bright et al. | 439/607.41 |
| 7,539,018 B2 | 5/2009 | Murr et al. | |
| 7,625,223 B1 | 12/2009 | Fogg | |
| 7,704,097 B1 * | 4/2010 | Phillips et al. | 439/607.01 |
| 7,723,621 B2 * | 5/2010 | Megason | 174/354 |
| 7,869,224 B1 * | 1/2011 | Yang | 361/800 |
| 2005/0013126 A1 * | 1/2005 | Hwang | 361/818 |
| 2007/0284142 A1 * | 12/2007 | Jonker | 174/354 |
| 2008/0060842 A1 * | 3/2008 | Barringer et al. | 174/354 |
| 2008/0299826 A1 * | 12/2008 | Cheng et al. | 439/607 |
| 2009/0109627 A1 * | 4/2009 | Murr et al. | 361/704 |

(Continued)

*Primary Examiner* — William H Mayo, III
*Assistant Examiner* — Rhadames J Alonzo Miller

(57) ABSTRACT

An electrical connector assembly includes a cage having an upper wall, a lower wall, and side walls that extend from the upper wall to the lower wall. The side walls have exterior sides. The cage includes an interior cavity and a divider that extends between the side walls and divides the interior cavity into at least two internal compartments. The cage includes a front end that is open to the internal compartments. The side walls have front edges at the front end. The internal compartments are configured to receive pluggable modules therein through the front end. An electromagnetic interference (EMI) cover is mounted to the divider such that the EMI cover is engaged with and electrically connected to the divider. The EMI cover includes a flap that wraps around the front edge of a corresponding side wall. The flap overlaps and engages the exterior side of the corresponding side wall.

20 Claims, 6 Drawing Sheets

(56) References Cited

U.S. PATENT DOCUMENTS

| | | | |
|---|---|---|---|
| 2009/0311908 A1* | 12/2009 | Fogg et al. | 439/607.05 |
| 2010/0151733 A1* | 6/2010 | Tsou | 439/607.55 |
| 2010/0254112 A1* | 10/2010 | Brown et al. | 361/818 |
| 2010/0266246 A1* | 10/2010 | van Haaster | 385/94 |
| 2011/0206328 A1* | 8/2011 | Wang | 385/94 |
| 2012/0083156 A1* | 4/2012 | Fogg et al. | 439/607.25 |
| 2012/0196477 A1* | 8/2012 | Nichols et al. | 439/607.01 |
| 2012/0231662 A1* | 9/2012 | Tsou | 439/607.55 |
| 2013/0033821 A1* | 2/2013 | Szczesny et al. | 361/704 |
| 2013/0034993 A1* | 2/2013 | Szczesny et al. | 439/607.17 |

* cited by examiner

ELECTRICAL CONNECTOR ASSEMBLY WITH EMI COVER

BACKGROUND OF THE INVENTION

The subject matter described and/or illustrated herein relates generally to electrical connector assemblies, and more particularly to electromagnetic interference (EMI) covers for electrical connector assemblies.

Various types of fiber optic and copper based transceiver assemblies that permit communication between host equipment and external devices are known. These transceiver assemblies typically include a pluggable module that is received within a receptacle assembly, which includes a receptacle connector that pluggable connects to the pluggable module. The pluggable modules are constructed according to various standards for size and compatibility, one standard being the Quad Small Form-factor Pluggable (QSFP) module standard. Conventional QSFP modules and receptacle assemblies perform satisfactorily conveying data signals at rates up to 10 gigabits per second (Gbps). Another pluggable module standard, the XFP standard, calls for the transceiver module to also convey data signals at rates up to 10 Gbps.

Receptacle assemblies typically include a metal cage having one or more ports that receive pluggable modules therein. But, electromagnetic interference (EMI) emissions may leak into and/or out of the cage and electrically interfere with the pluggable module(s) received within the cage or neighboring electrical devices, respectively. For example, some known cages include a divider that divide the cage into a plurality of ports for receiving a plurality of pluggable modules. EMI emissions may leak between an interface between the divider and one or more other segments of the cage, for example a side wall, a top wall, and/or a bottom wall of the cage.

BRIEF DESCRIPTION OF THE INVENTION

In one embodiment, An electrical connector assembly includes a cage having an upper wall, a lower wall, and side walls that extend from the upper wall to the lower wall. The side walls have exterior sides. The cage includes an interior cavity and a divider that extends between the side walls and divides the interior cavity into at least two internal compartments. The cage includes a front end that is open to the internal compartments. The side walls have front edges at the front end. The internal compartments are configured to receive pluggable modules therein through the front end. An electromagnetic interference (EMI) cover is mounted to the divider such that the EMI cover is engaged with and electrically connected to the divider. The EMI cover includes a flap that wraps around the front edge of a corresponding side wall such that the flap overlaps and engages the exterior side of the corresponding side wall.

In another embodiment, an electrical connector includes a cage having an interior cavity and a divider that divides the interior cavity into first and second internal compartments. The cage has a front end that is open to the first and second internal compartments. The first and second internal compartments are configured to receive first and second pluggable modules, respectively, therein through the front end. The divider includes a front wall, a top wall, and a bottom wall. The top and bottom walls are spaced apart from each other to define a chamber therebetween. The front wall extends from the top wall to the bottom wall at the front end of the cage. An electromagnetic interference (EMI) cover is mounted to the divider such that the EMI cover is engaged with and electrically connected to the divider. The EMI cover includes a front segment that covers at least a portion of the front wall of the divider. The EMI cover has first and second sets of electrically conductive springs that extend from the front segment into the first and second internal compartments, respectively. The first and second sets of electrically conductive springs are configured to engage and electrically connect to the first and second pluggable modules, respectively, when the first and second pluggable modules are received within the respective first and second internal compartments.

In another embodiment, an electrical connector assembly includes a cage having a wall that includes an exterior side. The cage includes an interior cavity and a divider that divides the interior cavity into at least two internal compartments. The cage includes a front end that is open to the internal compartments. The wall has a front edge at the front end. The internal compartments are configured to receive pluggable modules therein through the front end. An electromagnetic interference (EMI) cover is mounted to the divider such that the EMI cover is engaged with and electrically connected to the divider. The EMI cover includes a flap that wraps around the front edge of the wall such that the flap overlaps and engages the exterior side of the wall.

DETAILED DESCRIPTION OF THE INVENTION

Figure 1:
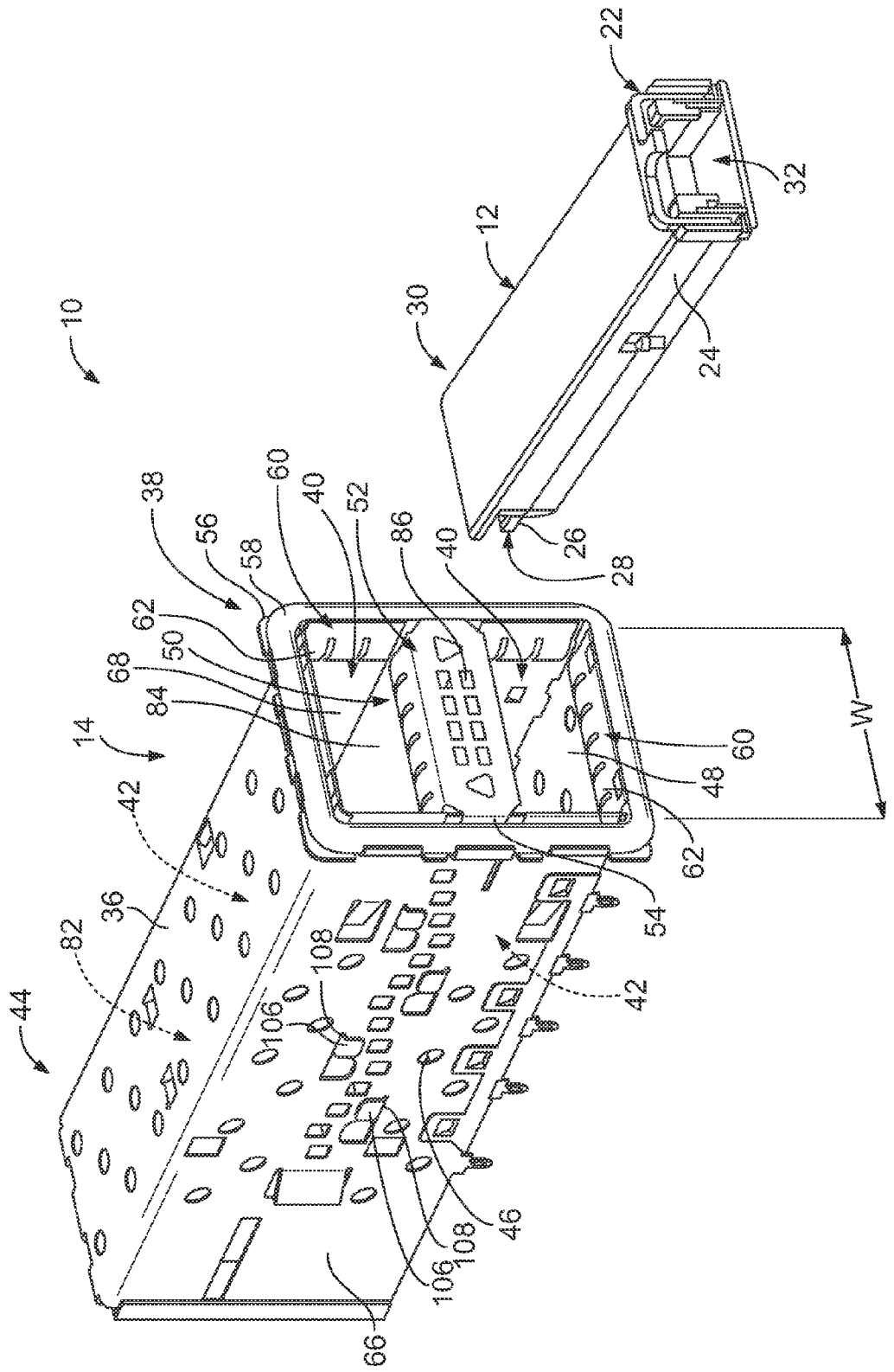
FIG. 1 is a partially exploded perspective view of an exemplary embodiment of a transceiver assembly.

FIG. 1 is a partially exploded perspective view of an exemplary embodiment of a transceiver assembly 10. In the exemplary embodiment, the transceiver assembly 10 is adapted to address, among other things, conveying data signals at high rates, such as data transmission rates of at least 10 gigabits per second (Gbps), which is required by the SFP+ standard. For example, in some embodiments the transceiver assembly 10 is adapted to convey data signals at a data transmission rate of at least 28 Gbps. Moreover, and for example, in some embodiments the transceiver assembly 10 is adapted to convey data signals at a data transmission rate of between approximately 20 Gbps and approximately 30 Gbps. It is appreciated, however, that the benefits and advantages of the subject matter described and/or illustrated herein may accrue equally to other data transmission rates and across a variety of systems and standards. In other words, the subject matter described and/or illustrated herein is not limited to data transmission rates of 10 Gbps or greater, any standard, or the exemplary type of transceiver assembly shown and described herein.

The transceiver assembly 10 includes one or more pluggable modules 12 configured for pluggable insertion into a receptacle assembly 14 that is mounted on a host circuit board (not shown). The host circuit board may be mounted in a host system (not shown) such as, but not limited to, a router, a server, a computer, and/or the like. The host system typically includes a conductive chassis (not shown) having a panel (not shown) including one or more openings (not shown) extending therethrough in substantial alignment with the receptacle assembly 14. The receptacle assembly 14 is optionally electrically connected to the panel. Only one pluggable module 12 is shown in FIG. 1 for clarity.

The pluggable module 12 is configured to be inserted into the receptacle assembly 14. Specifically, the pluggable module 12 is inserted into the receptacle assembly 14 through the panel opening such that a front end 22 of the pluggable module 12 extends outwardly from the receptacle assembly 14. The pluggable module 12 includes a housing 24 that forms a protective shell for a circuit board 26 that is disposed within the housing 24. The circuit board 26 carries circuitry, traces, paths, devices, and/or the like that perform transceiver functions in a known manner. An edge 28 of the circuit board 26 is exposed at a rear end 30 of the housing 24 for, in an exemplary embodiment, pluggable insertion into a receptacle connector not shown) of the receptacle assembly 14. In an alternative embodiment, a straddle mount connector (not shown) is mounted to the circuit board 26 and exposed at the rear end 30 of the housing 24 for plugging into the receptacle connector.

Each pluggable module 12 interfaces to one or more optical cables (not shown) and/or one or more electrical cables (not shown) through a connector interface 32 at the front end 22 of the module 12. Optionally, the connector interface 32 comprises a mechanism that cooperates with a fiber or cable assembly (not shown) to secure the fiber or cable assembly to the pluggable module 12. Suitable connector interfaces 32 are known and include adapters for the LC style fiber connectors and the MTP/MPO style fiber connectors offered by Tyco Electronics Corporation (Harrisburg, Pa.).

In general, the pluggable modules 12 and the receptacle assembly 14 may be used in any application requiring an interface between a host system and electrical and/or optical signals. Each pluggable module 12 interfaces to the host system through the receptacle assembly 14 via a corresponding receptacle connector of the receptacle assembly 14. The receptacle connectors are located within an electrically conductive cage 36 (which is sometimes referred to as a "receptacle guide frame" or a "guide frame") of the receptacle assembly 14. As illustrated in FIG. 1, the cage 36 includes a front end 38 having one or more front openings, or ports, 40 that are open to corresponding internal compartments 42 of the cage 36. The front end 38 of the cage 36 is configured to be mounted, or received, within the opening in the panel. A receptacle connector extends within each internal compartment 42 at a rear end 44 of the cage 36. The cage 36 includes one or more openings 46 extending through a lower wall 48 of the cage 36 for enabling each the receptacle connector(s) to electrically connect to the host circuit board from within the corresponding internal compartments 42. Each internal compartment 42 of the cage 36 is configured to receive the corresponding pluggable module 12 therein in electrical connection with the corresponding receptacle connector.

The cage 36 includes a divider 50 that divides the cage 36 into the plurality of internal compartments 42 shown in FIG. 1. The receptacle assembly 14 includes an electromagnetic interference (EMI) cover 52 mounted to the divider 50. As will be described below, the EMI cover 52 includes one or more flaps 54 that facilitate reducing and/or containing EMI emissions. A combination of the cage 36 and the EMI cover 52 may be referred to herein as an "electrical connector assembly".

The front end 38 of the cage 36 is configured to be mounted, or received, within the opening in the panel. The receptacle assembly 14 further includes a bracket 56 and a gasket 58. The gasket 58 extends around the front end 38 of the cage 36 to facilitate reducing and/or containing EMI emissions. When the front end 38 of the cage 36 is mounted within the panel opening, the gasket 58 is sandwiched between the bracket 56 and the panel. Optionally, the gasket 58 is configured to be at least partially compressed between the bracket 56 and the panel. EMI gaskets 60 are mounted to the front end 38 of the cage 36. The EMI gaskets 60 include electrically conductive springs 62 that extend within the ports 40 along a portion of the internal circumferences of the ports 40. The springs 62 engage the corresponding pluggable module 12 when the module 12 is installed in the corresponding internal compartment 42 of the cage 36 to facilitate reducing and/or containing electromagnetic interference (EMI) emissions by providing a plurality of contact points that ground the pluggable module 12 to the cage 36.

Although the cage 36 is shown as including a plurality of internal compartments 42 and a plurality of ports 40 for electrically connecting a plurality of pluggable modules 12 to the host circuit board, the cage 36 may include any number of internal compartments 42 and ports 40, arranged in any pattern, configuration, arrangement, and/or the like (such as, but not limited to, any number of rows and/or columns), for electrically connecting any number of pluggable modules 12 to the host circuit board. In the exemplary embodiment, the receptacle assembly 14 includes two internal compartments 42 and ports 40 that are arranged in a column, relative to the host circuit board, such that a width W of the divider 50 extends approximately parallel to the host circuit board. One example of another pattern, configuration, arrangement, and/ or the like of the internal compartments 42 and ports 40 includes two internal compartments 42 and ports 40 that are arranged in a row, relative to the host circuit board, such that the width W of the divider 50 extends approximately perpendicular to the host circuit board.

Figure 2:
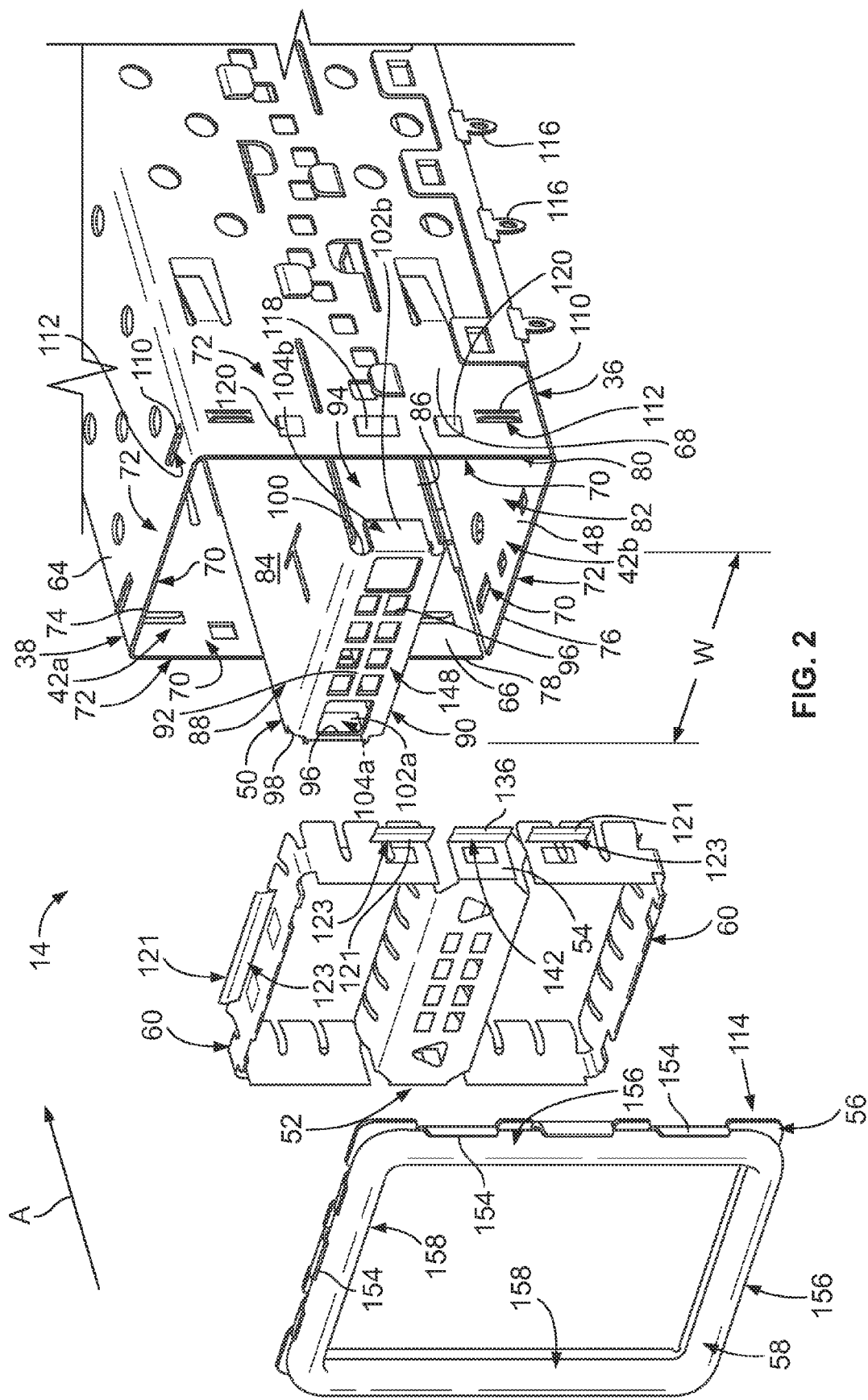
FIG. 2 is an exploded perspective view of a portion of an exemplary embodiment of a receptacle assembly of the transceiver assembly shown in FIG. 1.

FIG. 2 is an exploded perspective view of a portion of the receptacle assembly 14 illustrating the front end 38 of the cage 36. The cage 36 includes an upper wall 64, the lower wall 48, and side walls 66 and 68. The side walls 66 and 68 extend from the upper wall 64 to the lower wall 48. The walls 64, 48, 66, and 68 include interior sides 70 and exterior sides 72 that are opposite the interior surfaces 70. Each of the internal compartments 42 extends a width from the interior side 70 of the side wall 66 to the interior side 70 of the side wall 68. The walls 64, 48, 66, and 68 include respective edges 74, 76, 78, and 80 at the front end 38 of the cage 36. The cage 36 includes an interior cavity 82 that extends between the walls 64, 48, 66, and 68. The interior sides 70 of the walls 64, 48, 66, and 68 define boundaries of the interior cavity 82.

It should be understood that in embodiments wherein the divider 50 extends approximately perpendicular to the host circuit board, the side wall 66 may be considered an upper and/or a lower wall, the side wall 68 may be considered an upper and/or a lower wall, the upper wall 64 may be considered a side wall, and the lower wall 48 may be considered a side wall. The edge 74, 76, 78, and/or 80 may be referred to herein as a "front edge". Each of the side walls 66 and 68 may be referred to herein as a "first side wall" and/or a "second side wall". Each of the upper wall 64, the lower wall 48, the side wall 66, and the side wall 68 may be referred to herein as a "wall".

The cage 36 includes the divider 50. The divider 50 extends between the side walls 66 and 68, and more specifically extends from the side wall 66 to the side wall 68. The divider 50 divides the interior cavity 82 of the cage 36 into the internal compartments 42. The divider 50 includes a top wall 84 and a bottom wall 86, which include exterior sides 88 and 90, respectively. The exterior side 88 of the top wall 84 defines a boundary of one of the internal compartments 42a, while the exterior side 90 of the bottom wall 86 defines a boundary another of the internal compartments 42b. The interior sides 70 of the upper wall 64 and the side walls 66 and 68 define boundaries of the internal compartment 42a. The interior sides 70 of the lower wall 48 and the side walls 66 and 68 define boundaries of the internal compartment 42b. Optionally, the top wall 84 and/or the bottom wall 86 engages the housing 24 of the corresponding pluggable module 12 along a substantial entirety of the width of the respective internal compartment 42a and 42b when the corresponding pluggable module 12 is received within the internal compartment 42a and 42b, respectively. Each of the top wall 84 and the bottom wall 86 may be referred to herein as a "divider wall". Each of the internal compartments 42a and 42b may be referred to herein as a "first internal compartment" and/or a "second internal compartment".

The divider 50 includes a front wall 92 that extends from the top wall 84 to the bottom wall 86 at the front end 38 of the cage 36. The top wall 84 and the bottom wall 86 are spaced apart from each other to define a chamber 94 therebetween. The chamber 94 is optionally configured to hold one or more components, such as, but not limited to, an electrical component, an optical component, an indicator light, a status light, and/or the like. Optionally, the front wall 92 includes one or more windows 96 for exposing one or more components held within the chamber 94, for example for enabling an indicator and/or status light to be visible through the front wall 92. Each of the windows 96 may be referred to herein as a "divider window".

The front wall 92 includes opposite edges 98 and 100 that extend from the top wall 84 to the bottom wall 86. Optionally, the divider 50 includes one or more flaps 102 that facilitate reducing and/or containing EMI emissions. In the exemplary embodiment, the divider 50 includes a flap 102a that extends from the edge 98 of the front wall 92, and a flap 102b that extends from the edge 100 of the front wall 92. The flaps 102a and 102b include exterior sides 104a and 104b, respectively, that are configured to engage the interior sides 70 of the side walls 66 and 68, respectively, of the cage 36. The flaps 102a and 102b may extend outwardly from the front wall 92 at any angle relative to the front wall 92 that enables the flaps 102a and 102b to engage the interior sides 70 of the side walls 66 and 68, respectively. In some embodiments, the flaps 102a and/or 102b extend outwardly from the front wall 92 at an approximately 90° angle relative to the front wall 92. In some embodiments, the flaps 102a and/or 102b extend outwardly from the front wall 92 at an oblique angle relative to the front wall 92. Optionally, the flaps 102a and/or 102b are resilient springs that are configured to resiliently deflect during engagement with the interior sides 70 of the side walls 66 and 68, respectively. Each of the flaps 102a and 102b may be referred to herein as a "divider flap". Each of the edges 98 and 100 may be referred to herein as a "side edge".

Referring again to FIG. 1, the divider 50 optionally includes one or more mounting tabs 106 for mounting the divider 50 within the interior cavity 82 of the cage 36. In the exemplary embodiment, the mounting tabs 106 extend from the top wall 84 and the bottom wall 86, extend through openings 108 within the side walls 66 and 68 of the cage 36, and are folded over the cage 36 to hold the divider 50 to the cage 36. Any other type, number, structure, location, and/or the like of the mounting tabs 106 may be provided. Optionally, the mounting gabs 106 electrically connect the divider 50 to the cage 36.

Referring again to FIG. 2, the cage 36 includes one or more stops 110 for holding the bracket 56 on the front end 38 of the cage 36. Each stop 110 includes front side 112 that faces generally toward the front end 38 of the cage 36. The front sides 112 of the stops 110 engage a rear side 114 of the bracket 56. The cage 36 may include any number of the stops 110. The cage 36 may have features that ground the cage 36 to the host circuit board, the panel, and/or the conductive chassis. For example, the cage 36 may include a plurality of circuit board tines 116, which may both mechanically hold and ground the cage 36 to the host circuit board. Additionally or alternatively, the cage 36 may include one or more resilient tongues (not shown) extending from the lower wall 48 to provide grounding of the cage 36 to the host circuit board. In an exemplary embodiment, the cage 36 includes a generally rectangular cross-sectional shape, defined by the walls 64, 48, 66, and 68, such that the cage 36 generally has the shape of a parallelepiped. But, the cage 36 may include any other shape.

The cage 36 includes one or more tabs 118 that facilitate holding the EMI cover 52 on the front end 38 of the cage 36, and more specifically on the divider 50. The tabs 118 extend outwardly on the exterior sides 72 of the side walls 66 and 68 for cooperating with the EMI cover 52, as will be described below. The tab 118 on the side wall 66 is not visible herein.

The cage 36 includes tabs 120 that extend outwardly on the exterior sides 72 of the side walls 66 and 68. The tabs 120 cooperate with the EMI gaskets 60 to hold the EMI gaskets 60 on the front end 38 of the cage 36. More specifically, when the EMI gaskets 60 are mounted on the front end 38 of the cage 36, the tabs 120 are received within openings 120 of the EMI gaskets 60.

The EMI gaskets 60 optionally include flanges 121 that include front sides 123 that are configured to engage the rear side 114 of the bracket 56, as will be described below.

Figure 3:
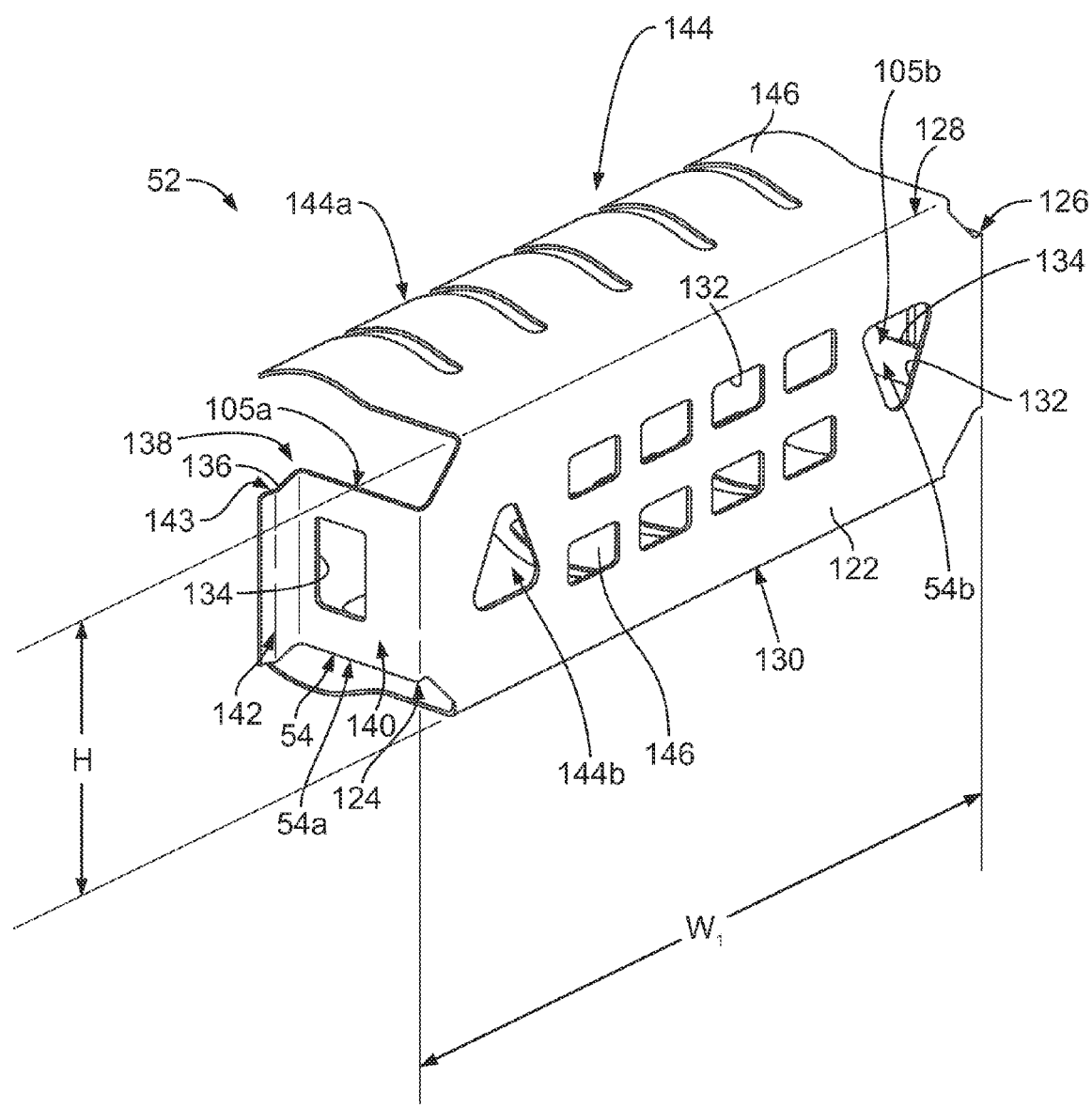
FIG. 3 is a perspective view of an exemplary embodiment of an EMI cover of the receptacle assembly shown in FIG. 2.

FIG. 3 is a perspective view of the EMI cover 52. The EMI cover 52 includes a front segment 122 that extends a width $W_1$ from an edge 124 to an opposite edge 126. The front segment 122 extends a height H from an edge 128 to an opposite edge 130. When the cover 52 is mounted to the divider 50 (FIGS. 1, 2, 4, and 5), the edges 128 and 130 extend along the edges 78 and 80 (FIGS. 2 and 4), respectively, of the side walls 66 and 68 (FIGS. 1, 2, and 4), respectively. The front segment 122 of the EMI cover 52 is configured to cover at least a portion of the front wall 92 (FIGS. 2 and 4) of the divider 50 when the EMI cover 52 is mounted to the divider 50. Optionally, the front segment 122 includes one or more windows 132. The windows 132 are aligned with corresponding windows 96 (FIGS. 2 and 4) of the divider 50 for exposing one or more components held within the chamber 94 (FIG. 2) of the divider 50. Each of the edges 124 and 126 may be referred to herein as a "side edge". Each of the edges 128 and 130 may be referred to herein as an "upper edge" and/or a "lower edge". Each of the windows 132 may be referred to herein as a "cover window".

As described above, the EMI cover 52 includes one or more flaps 54 that facilitate reducing and/or containing EMI emissions. In the exemplary embodiment, the EMI cover 52 includes two flaps 54a and 54b that extend from the front segment 122 of the EMI cover 52. The flap 54a extends outwardly from the edge 124 of the front segment 122, while the flap 54b extends outwardly from the edge 126 of the front segment 122. The flaps 54a and 54b include respective interior sides 105a and 105b that are configured to engage the exterior sides 72 (FIGS. 2, 5, and 6) of the side walls 66 and 68, respectively, of the cage 36. The flaps 54a and 54b may each extend outwardly from the front segment 122 at any angle relative to the front segment 122 that enables the flaps 54a and 54b to engage the exterior sides 72 of the side walls 66 and 68, respectively. In some embodiments, the flaps 54a and/or 54b extend outwardly from the front segment 122 at an approximately 90° angle relative to the front segment 122. In some embodiments, the flaps 54a and/or 54b extend outwardly from the front segment 122 at an oblique angle relative to the segment 122.

Each flap 54 includes an optional opening 134 that is configured to receive a corresponding optional tab 118 (FIGS. 2 and 4) of the cage 36 therein. The cooperation between the flap 54 and the corresponding tab 118 facilitates holding the EMI cover 52 on the front end 38 of the cage 36, and more specifically on the divider 50. Optionally, the flaps 54a and/or 54b are resilient springs that are configured to resiliently deflect during engagement with the side walls 66 and 68, respectively, and/or during reception of the tab 118 within the opening 134. Each of the flaps 54a and 54b may be referred to herein as a "cover flap", a "first flap", and/or a "second flap".

The flaps 54 optionally include a flange 136 that extends outwardly at an end 138 of the flap 54. The flange 136 of the flap 54b is not visible in FIG. 3. The flange 136 may extend an any angle relative to a main segment 140 of the flap 54, such as, but not limited to, an approximately 90° angle or an oblique angle. The flange 136 includes a front side 142 that is configured to engage the rear side 114 (FIGS. 2 and 6) of the bracket 56 (FIGS. 1, 2, and 6), as will be described below.

Optionally, the EMI cover 52 includes one or more sets 144 of a plurality of electrically conductive springs 146. In the exemplary embodiment, the EMI cover 52 includes two sets 144a and 144b of springs 146. The springs 146 of the set 144a extend into the internal compartment 42a (FIG. 2) at the front end 38 of the cage 36 when the EMI cover 52 is mounted to the divider 50. When the EMI cover 52 is mounted to the divider 50, the springs 146 of the set 144b extend into the internal compartment 42b (FIG. 2) at the front end 38 of the cage 36. The springs 146 of the set 144a extend outwardly from the edge 128 of the front segment 122, while the springs 146 of the set 144b extend outwardly from the edge 130 of the front segment 122. When the corresponding pluggable module 12 (FIG. 1) is received within the corresponding internal compartment 42a or 42b, the springs 146 engage the housing 24 (FIG. 1) of the corresponding pluggable module 12 to electrically connect the springs 146, and therefore the EMI cover 52, to the corresponding pluggable module 12. Each set 144a and 144b may include any number of the springs 146. Each of the sets 144a and 144b may be referred to herein as a "first set" and/or a "second set".

Figure 4:
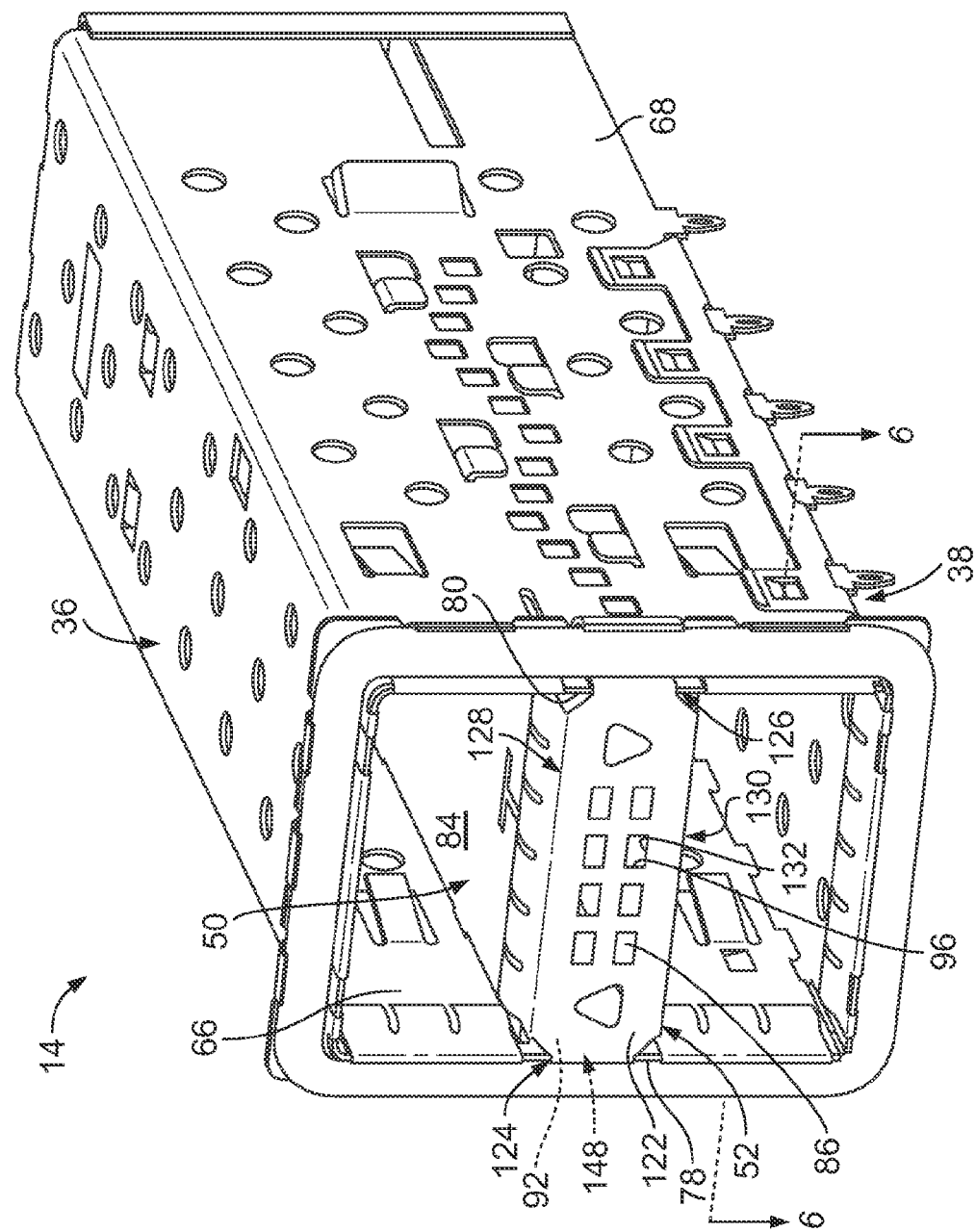
FIG. 4 is a perspective view of the portion of the receptacle assembly shown in FIG. 2 illustrating the receptacle assembly in an unexploded state.

FIG. 4 is a perspective view of a portion of the receptacle assembly 14 illustrating the receptacle assembly 14 in an unexploded state. The EMI cover 52 is mounted to the divider 50 and the front end 38 of the cage 36. The EMI cover 52 is engaged with, and thereby electrically connected to, the divider 50. For example, the front segment 122 of the EMI cover 52 is engaged with the front wall 92 of the divider 50. The front segment 122 of the EMI cover 52 covers at least a portion of the front wall 92 of the divider 50. In the exemplary embodiment, and as should be apparent from FIG. 4, the front segment 122 covers a substantial entirety of a front side 148 (best seen in FIG. 2) of the front wall 92.

The edges 124 and 126 of the front segment 122 of the EMI cover 52 extend along the edges 78 and 80, respectively, of the respective side walls 66 and 68. The edge 128 of the front segment 122 extends along an intersection of the top wall 84 and the front wall 92 of the divider 50, while the edge 130 extends along an intersection of the bottom wall 86 and the front wall 92 of the divider 50. The windows 132 of the EMI cover 52 are aligned with the corresponding windows 96 of the divider 50.

Figure 5:
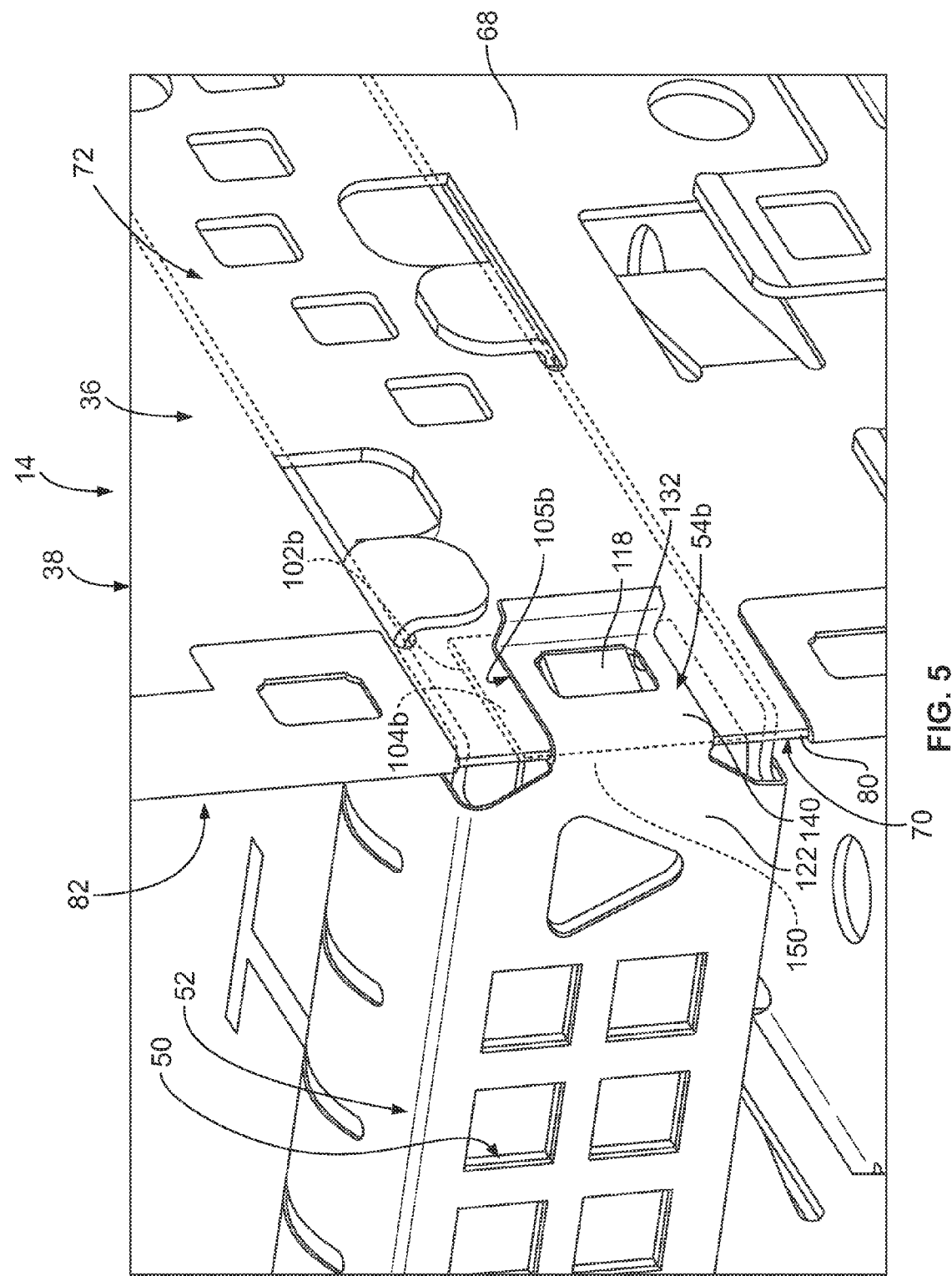
FIG. 5 is an enlarged perspective view of a portion of the receptacle assembly shown in FIGS. 2 and 4.

FIG. 5 is an enlarged perspective view of a portion of the receptacle assembly 14 illustrating the EMI cover 52 mounted to the divider 50 at the front end 38 of the cage 36. The bracket 56 and gasket 58 have been removed from FIG. 5 to better illustrate the flap 54b. As can be seen in FIG. 5, the flap 54b wraps around the edge 80 of the side wall 68 of the cage 36 such that the flap 54b overlaps and engages the side wall 68. More specifically, the main segment 140 of the flap 54b overlaps the exterior side 72 of the side wall 68 and the interior side 105b of the flap 54b is engaged with the exterior side 72 of the side wall 68. In the exemplary embodiment, the tab 118 that extends outwardly on the exterior side 72 of the side wall 68 is received within the opening 132 of the flap 54b to facilitate holding the EMI cover 52 on the divider 50 and the front end 38 of the cage 36. Optionally, the tab 118 and the opening 132 of the flap 54b cooperate with a snap-fit connection, wherein the tab 118 snaps-into the opening 132. But, any other mechanical connection arrangement between the tab 118 and the opening 132 of the flap 54b may be provided. Moreover, the opening 132 and the tab 118 are optional, as is described above. In addition or alternative to the tab 118 and/or the opening 132, the flap 54b may be connected to the side wall 68 using any other connection type, such as, but not limited to, a latch, welding, friction and/or stiction between the interior side 104b of the flap 54b and the exterior side 72 of the side wall 68, and/or the like.

As can be seen in FIG. 5, the flap 54b facilitates sealing at least a portion of a seam 150 that extends between the divider 50 and the interior side 70 of the side wall 68 at the front end 38 of the cage 36. More specifically, the flap 54b and a portion of the front segment 122 from which the flap 54b extends extend along and overlap, or extend over, at least a portion of the seam 150. The flap 54b and the front segment 122 thereby facilitate preventing EMI emissions from leaking into and/or out of the interior cavity 82 of the cage 36 through the seam 150.

The flap 102b of the divider 50 overlaps and engages the side wall 68 within the interior cavity 82 of the cage 36. More specifically, the flap 102b overlaps the interior side 70 of the side wall 68 and the exterior side 104b of the flap 102b is engaged with the interior side 70 of the side wall 68, as can be seen in FIG. 5. The flap 102b facilitates sealing at least a portion of the seam 150 to facilitate preventing EMI emissions from leaking into and/or out of the interior cavity 82 of the cage 36 through the seam 150.

As should be apparent from a comparison of FIGS. 4 and 5, the flap 54a wraps around the edge 78 (FIGS. 2 and 4) of the side wall 66 (FIGS. 1, 2, and 4) and overlaps and engages the side wall 66 in a substantially similar manner to that described and illustrated herein with respect to the flap 54b and the edge 80 of the side wall 68. The flap 54a thereby facilitates sealing at least a portion of a seam (not shown) that extends between the divider 50 and the interior side 70 of the side wall 66 at the front end 38 of the cage 36. Accordingly, function of the flap 54a will not be described further herein. Moreover, the flap 102a of the divider 50 overlaps and engages the side wall 66 within the interior cavity 82 of the cage 36 in a substantially similar manner to that described and illustrated herein with respect to the flap 102b and the side wall 68. The flap 102a thereby facilitates sealing at least a portion of the seam that extends between the divider 50 and the interior side 70 of the side wall 66 at the front end 38 of the cage 36. Accordingly, function of the flap 102a will not be described further herein.

Figure 6:
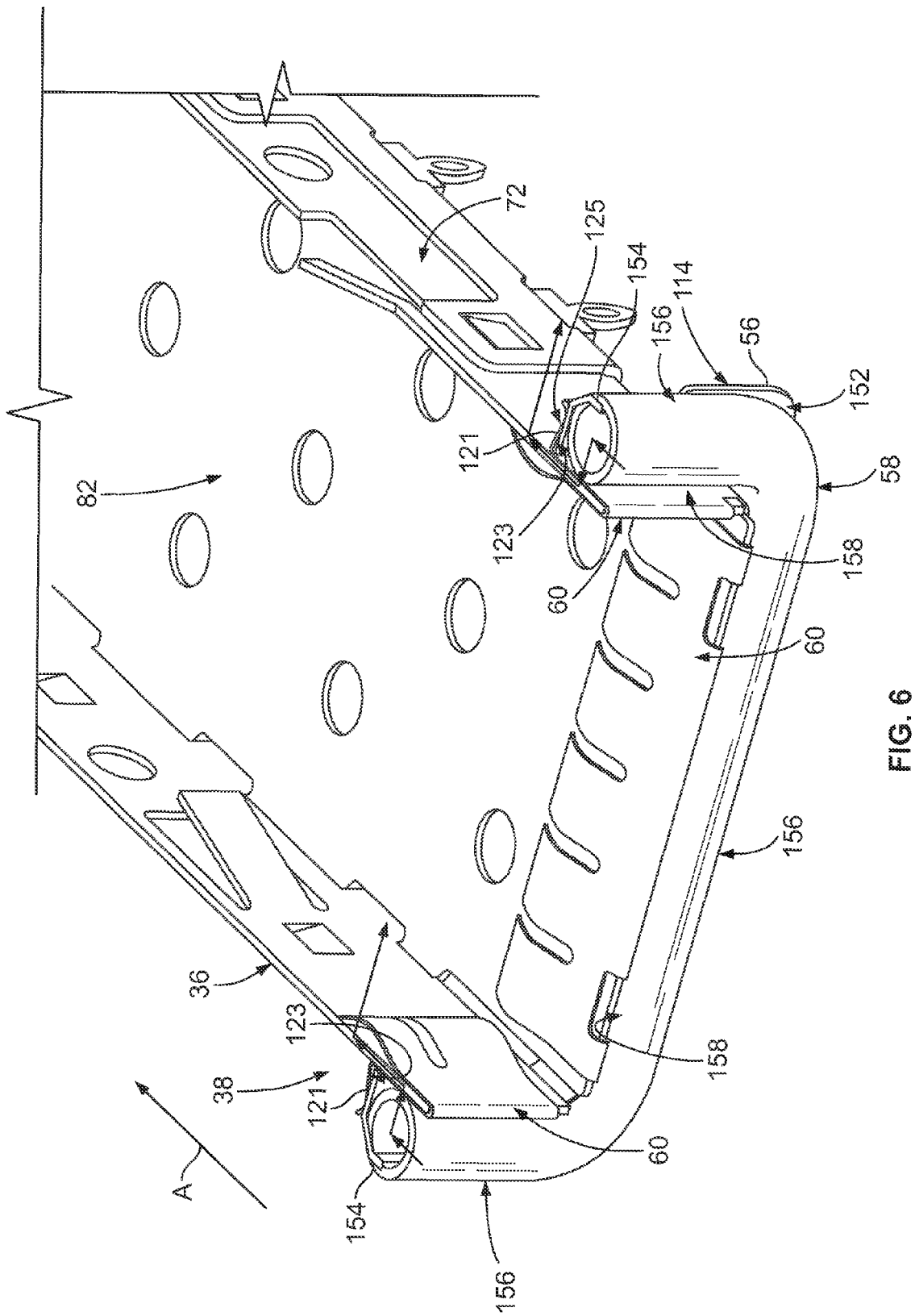
FIG. 6 is a perspective view illustrating a portion of a cross section of the receptacle assembly shown in FIG. 4 taken along line 6-6 of FIG. 4.

FIG. 6 is a perspective view illustrating a portion of a cross section of the receptacle assembly 14 taken along line 6-6 of FIG. 4. Referring now to FIGS. 2 and 6, the bracket 56 is mounted to the front end 38 of the cage 36 such that the bracket 56 extends at least partially around the EMI gaskets 60 and the flaps 54 (not shown in FIG. 6) of the EMI cover 52 (not shown in FIG. 6). The bracket 56 optionally engages the EMI gaskets 60, the flaps 54, and/or the exterior side 72 of the cage 36 when the bracket 56 is mounted to the front end 38 of the cage 36. In some embodiments, the bracket 56 floats relative to the EMI gaskets 60, the flaps 54, and/or the exterior side 72 of the cage 36 when the bracket 56 is mounted to the front end 38 of the cage 36. The bracket 56 includes the rear side 114 and an opposite front side 152. The front side 112 (not visible in FIG. 6) of the stops 110 (not visible in FIG. 6) of the cage 36 engage the rear side 114 of the bracket 56 to prevent the bracket 56 from moving along the length of the cage 36 in the direction of the arrow A.

The bracket 56 includes one or more flanges 154 that engage the gasket 58. More specifically, and as best seen in FIG. 6, each flange 154 engages a radially outer side 156 of the gasket 58. The flanges 154 press the gasket 58 radially inward such that a radially inner side 158 of the gasket 58 is engaged with the EMI gaskets 60, the flaps 54, and segments of the exterior side 72 of the cage 36 that are exposed between the gaskets 60 and/or flaps 54. The flanges 154 may facilitate providing a tight fit around the circumference of the front end 38 of the cage 36 between the gasket 58 and the EMI gaskets 60, the flaps 54, and segments of the exterior side 72 of the cage 36 that are exposed between the gaskets 60 and/or flaps 54. The flanges 154 may therefore facilitate reducing or containing EMI emissions into and/or out of the interior cavity 82 of the cage 36. The bracket 56 may include any number of the flanges 154.

As can be seen in FIG. 6, the rear side 114 of the bracket 56 is engaged with the front sides 123 of the flanges 121 of the EMI gaskets 60. Although not shown in FIG. 6 but should be apparent from FIG. 2, the rear side 114 of the bracket 56 is also engaged with the front sides 142 of the flanges 136 of the EMI cover 52. The engagement between the bracket 56 and the flanges 121 and between the bracket 56 and the flanges 136 electrically connects the bracket 56 to the EMI gaskets 60 and the EMI cover 52. The engagement between the bracket 56 and the flanges 121 and between the bracket 56 and the flanges 136 may provide a greater number of points of electrical connection between the bracket 56 and the front end 38 of the cage 36, which may facilitate reducing or containing EMI emissions into and/or out of the interior cavity 82 of the cage 36.

In the exemplary embodiment, the rear side 114 of the bracket 56 is engaged with the front sides 123 and 142 of the EMI gasket flanges 121 and the EMI cover flanges 136, respectively. In some alternative embodiments, the flanges 121 and/or 136 extend between the gasket 58 and the bracket 56. For example, in some alternative embodiments, the flanges 121 and/or the flanges 136 are positioned to engage the front side 152 of the bracket 56. In such alternative embodiments, rear sides 125 and/or 143 (FIG. 3) of the respective flanges 121 and/or 136 are engaged with the front side 152 of the bracket 56, while the front sides 123 and/or 142 of the respective flanges 121 and/or 136 may be engaged with the gasket 58.

The embodiments described and/or illustrated herein may facilitate reducing or containing EMI emissions.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector assembly comprising:
a cage comprising an upper wall, a lower wall, and side walls that extend from the upper wall to the lower wall, the side walls having exterior sides, the cage including an interior cavity and a divider that extends between the side walls and divides the interior cavity into at least two internal compartments, the cage comprising a front end that is open to the internal compartments, the side walls having front edges at the front end, the internal compartments being configured to receive pluggable modules therein through the front end; and
an electromagnetic interference (EMI) cover mounted to the divider such that the EMI cover is engaged with and electrically connected to the divider, the EMI cover comprising a flap that wraps around the front edge of a corresponding side wall such that the flap overlaps and engages the exterior side of the corresponding side wall.

2. The assembly of claim 1, wherein the flap is a first flap and the corresponding side wall is a first side wall, the EMI cover comprising a second flap that extends over the front edge of a second of the side walls such that the second flap overlaps and engages the exterior side of the second side wall.

3. The assembly of claim 1, wherein the divider comprises a front wall that extends at the front end of the cage, the EMI cover comprising a front segment that covers at least a portion of the front wall of the divider, the flap extending from the front segment of the EMI cover.

4. The assembly of claim 1, wherein the EMI cover comprises electrically conductive springs that extend into a corresponding internal compartment at the front end of the cage, the springs being configured to engage and electrically connect to a corresponding pluggable module when the corresponding pluggable module is received within the corresponding internal compartment.

5. The assembly of claim 1, wherein the divider comprises a front wall, a top wall, and a bottom wall, the top and bottom walls being spaced apart from each other to define a chamber therebetween, the front wall extending from the top wall to the bottom wall at the front end of the cage, the EMI cover comprising a front segment that covers at least a portion of the front wall of the divider, the front segment comprising a side edge that extends along the front edge of the corresponding side wall, the flap extending outwardly from the side edge.

6. The assembly of claim 1, wherein the corresponding side wall of the cage comprises a tab that extends outwardly on the exterior side of the corresponding side wall, the flap comprising an opening that receives the tab therein.

7. The assembly of claim 1, wherein the flap is a cover flap and the side walls comprise interior sides that define boundaries of the internal compartments, the divider comprising a divider flap that extends outwardly from the divider such that the divider flap overlaps and engages the interior side of a corresponding side wall.

8. The assembly of claim 1, wherein the flap is a cover flap and the side walls comprise interior sides, the divider including a front wall, a top wall, and a bottom wall, the top and bottom walls being spaced apart from each other to define a chamber therebetween, the front wall extending from the top wall to the bottom wall at the front end of the cage, the front wall comprising a side edge that extends along the front edge of a corresponding side wall, the divider comprising a divider flap that extends outwardly from the side edge such that the divider flap overlaps and engages the interior side of the corresponding side wall.

9. The assembly of claim 1, wherein the divider comprises a divider wall that defines a boundary of a corresponding internal compartment of the cage, the corresponding internal compartment extending a width from a first of the side walls to a second of the side walls, wherein the divider wall engages a corresponding pluggable module along a substantial entirety of the width of the corresponding internal compartment when the corresponding pluggable module is received within the corresponding internal compartment.

10. An electrical connector assembly comprising:
a cage comprising an interior cavity and a divider that divides the interior cavity into first and second internal compartments, the cage having a front end that is open to the first and second internal compartments, the first and second internal compartments being configured to receive first and second pluggable modules, respectively, therein through the front end, the divider comprising a front wall, a top wall, and a bottom wall, the top and bottom walls being spaced apart from each other to define a chamber therebetween, the front wall extending from the top wall to the bottom wall at the front end of the cage, and
an electromagnetic interference (EMI) cover mounted to the divider such that the EMI cover is engaged with and electrically connected to the divider, the EMI cover comprising a front segment that covers at least a portion of the front wall of the divider, the EMI cover having first and second sets of electrically conductive springs that extend from the front segment into the first and second internal compartments, respectively, the first and second sets of electrically conductive springs being configured to engage and electrically connect to the first and second pluggable modules, respectively, when the first and second pluggable modules are received within the respective first and second internal compartments.

11. The assembly of claim 10, wherein the front segment of the EMI cover comprises an upper edge and a lower edge, the upper edge extending along an intersection of the top and front walls of the divider, the lower edge extending along an intersection of the bottom and front walls of the divider, the first set of electrically conductive springs extending outwardly from the upper edge of the front segment of the EMI cover, the second set of electrically conductive springs extending outwardly from the lower edge of the front segment.

12. The assembly of claim 10, wherein the front segment of the EMI cover covers a substantial entirety of a front side of the front wall of the divider.

13. The assembly of claim 10, wherein the front wall of the divider comprises a divider window, the front segment of the EMI cover comprising a cover window that is aligned with the divider window.

14. The assembly of claim 10, wherein the cage comprises a wall having a front edge at the front end of the cage, the wall having an exterior side, the EMI cover comprising a flap that wraps around the front edge of the wall such that the flap overlaps and engages the exterior side of the wall.

15. An electrical connector assembly comprising:
a cage having a wall that includes an exterior side, the cage comprising an interior cavity and a divider that divides the interior cavity into at least two internal compartments, the cage comprising a front end that is open to the internal compartments, the wall having a front edge at the front end, the internal compartments being configured to receive pluggable modules therein through the front end; and
an electromagnetic interference (EMI) cover mounted to the divider such that the EMI cover is engaged with and electrically connected to the divider, the EMI cover comprising a flap that wraps around the front edge of the wall such that the flap overlaps and engages the exterior side of the wall.

16. The assembly of claim 15, further comprising a bracket mounted to the front end of the cage, the flap of the EMI cover comprising a flange that extends outwardly from the flap, the flange being engaged with the bracket.

17. The assembly of claim 15, further comprising a bracket and an EMI gasket, the bracket being mounted to the front end of the cage, the EMI gasket being mounted to the front end of the cage and comprising electrically conductive springs that extend into a corresponding internal compartment, the EMI gasket comprising a flange that is engaged with the bracket.

18. The assembly of claim 15, wherein the divider comprises a front wall, a top wall, and a bottom wall, the top and bottom walls being spaced apart from each other to define a chamber therebetween, the front wall extending from the top wall to the bottom wall at the front end of the cage, the EMI cover comprising a front segment that covers at least a portion of the front wall of the divider, the front segment comprising a side edge that extends along the front edge of the wall of the cage, the flap extending outwardly from the side edge.

19. The assembly of claim 15, wherein the wall of the cage comprises a tab that extends outwardly on the exterior side of the wall, the flap comprising an opening that receives the tab therein.

20. The assembly of claim 15, wherein the flap is a cover flap and the wall comprises an interior side that defines a boundaries of the internal compartments, the divider comprising a divider flap that extends outwardly from the divider such that the divider flap overlaps and engages the interior side of the wall.

* * * * *